(12) United States Patent
Murai

(10) Patent No.: US 8,279,516 B2
(45) Date of Patent: Oct. 2, 2012

(54) WAVELENGTH CONVERSION DEVICE AND WAVELENGTH CONVERSION METHOD

(75) Inventor: Hitoshi Murai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 458 days.

(21) Appl. No.: 12/695,435

(22) Filed: Jan. 28, 2010

(65) Prior Publication Data

US 2011/0181943 A1 Jul. 28, 2011

(51) Int. Cl.
*H01S 3/10* (2006.01)
(52) U.S. Cl. ........................ 359/326; 359/333
(58) Field of Classification Search .......... 359/333, 359/326
See application file for complete search history.

(56) References Cited

U.S. PATENT DOCUMENTS

| | | | | |
|---|---|---|---|---|
| 5,532,868 | A * | 7/1996 | Gnauck et al. | 359/332 |
| 6,043,927 | A * | 3/2000 | Islam | 359/332 |
| 6,445,848 | B1 * | 9/2002 | Islam et al. | 385/24 |
| 6,879,433 | B1 * | 4/2005 | Yamashita et al. | 359/332 |
| 7,239,440 | B2 * | 7/2007 | Tanaka | 359/326 |
| 7,602,544 | B2 * | 10/2009 | Murai | 359/326 |
| 2001/0013965 | A1 * | 8/2001 | Watanabe | 359/161 |
| 2004/0184139 | A1 * | 9/2004 | Tamai et al. | 359/326 |

OTHER PUBLICATIONS

Matsumoto, Masayuki, "A Fiber-based All-optical 3R Regenerator for DPSK Signals", Proceedings of the IEICE General Conference 2006, B-10-22.

* cited by examiner

*Primary Examiner* — Isam Alsomiri
*Assistant Examiner* — Ari M Diacou
(74) *Attorney, Agent, or Firm* — Rabin & Berdo, P.C.

(57) ABSTRACT

A first wavelength converter of a wavelength-conversion device includes: an optical amplifier amplifying an incident light beam; a first dispersion flat fiber spreading the wavelength spectrum width of the amplified beam; and a first wavelength filter transmitting a predetermined wavelength bandwidth of the first fiber output beam. A center wavelength of the first wavelength converted beam is shifted by $\Delta\lambda 1$ from that of the incident light beam. A second wavelength converter of the device does not include an optical amplifier and includes: a second dispersion flat fiber spreading the wavelength spectrum width of the first wavelength converted beam; and a second wavelength filter transmitting a predetermined wavelength bandwidth of the second fiber output beam. A center wavelength of the second wavelength converted beam is shifted by $\Delta\lambda 2$ from that of the first wavelength converted beam. The $\Delta\lambda 1$ and $\Delta\lambda 2$ satisfy $\Delta\lambda 1+\Delta\lambda 2=\Delta\lambda$, $\Delta\lambda 1\times\Delta\lambda 2<0$, and $|\Delta\lambda 1|<|\Delta\lambda 2|$.

5 Claims, 12 Drawing Sheets

(1)

(2)

(3)

US 8,279,516 B2

WAVELENGTH CONVERSION DEVICE AND WAVELENGTH CONVERSION METHOD

CROSS-REFERENCE TO RELATED APPLICATION

This application is based on Japanese Patent Application No. 2008-312966, the entire disclosure of which is incorporated by reference herein.

BACKGROUND OF THE INVENTION

1. Field of the Invention

The present invention relates to a wavelength conversion device and a wavelength conversion method and, more particularly, to all-optical wavelength conversion used in an optical communication system.

2. Description of the Related Art

A technology of performing signal processing on an optical signal without converting to an electric signal, that is, performing all-optical signal processing is important in an optical communication system.

Referring to FIG. 9, a description will be given of a conventional differential phase shift keying (DPSK) signal regenerator (see, for example, Masayuki MATSUMOTO, "A Fiber-based All-optical 3R Regenerator for DPSK Signals" Proceedings of the IEICE General Conference 2006, B-10-22).

A DPSK signal input into a DPSK signal regenerator 100 is divided into two: one is sent to a delay interferometer 105 and the other is sent to a clock regenerator 180.

The delay interferometer 105 converts the DPSK signal into an on/off keying (OOK) signal. The OOK signal generated in the delay interferometer 105 is sent to an all-optical wavelength converter 110.

The all-optical wavelength converter 110 performs wavelength conversion and amplitude stabilization of the optical signal. The wavelength-converted OOK signal which has been wavelength-converted in the all-optical wavelength converter 110 is sent to a phase modulator 190.

On the other hand, the clock regenerator 180 extracts clock components from the DPSK signal and generates an optical clock pulse signal. The optical clock pulse signal is sent to the phase modulator 190.

The phase modulator 190 is provided with, for example, a dispersion flat fiber (DFF) as a high non-linear fiber. The wavelength-converted OOK signal and the optical clock pulse signal are input into the dispersion flat fiber. A phase modulation pattern that matches with the intensity modulation pattern of the wavelength-converted OOK signal is superimposed on the optical clock pulse signal due to cross-phase modulation (XPM) performed during propagation through the dispersion flat fiber. As a result, a wavelength-converted DPSK signal is output from the phase modulator 190.

The all-optical wavelength converter 110 is provided with an optical amplifier 142, a dispersion flat fiber (DFF) 146 as a high non-linear fiber, and an optical band-pass filter 148. Explanation will be made on the configuration and operation of the all-optical wavelength converter 110 with reference to FIGS. 10 to 12D.

FIG. 10 is a diagram schematically illustrating the configuration of the all-optical wavelength converter. FIGS. 11 and 12 are diagrams illustrating wavelength conversion in the all-optical wavelength converter.

The optical amplifier 142 amplifies an input OOK signal (indicated by an arrow S141 in FIG. 10), and generates an amplified signal (indicated by an arrow S143 in FIG. 10) ((1) of FIG. 11). The dispersion flat fiber 146 spreads a wavelength spectrum width of the amplified signal S143, and generates a DFF signal (indicated by an arrow S147 in FIG. 10). The optical band-pass filter 148 has a wavelength band having a different center wavelength from that of the input OOK signal S141 ((2) of FIG. 11). Therefore, a converted OOK signal (indicated by an arrow S149 in FIG. 10), which is an output from the optical band-pass filter 148, is converted into an OOK signal having a wavelength different by wavelength shift amount of $\Delta\lambda$ from that of the input OOK signal S141 ((3) of FIG. 11).

Referring to FIG. 12, the relationship between the signal intensity of the amplified signal S143 and the wavelength spectrum width of the DFF signal S147.

Assuming that a DFF signal indicated by II in (2) of FIG. 12 has been obtained by a self-phase modulation in the dispersion flat fiber 146 on an amplified signal indicated by II in (1) of FIG. 12. When the signal intensity of the amplified signal is increased (indicated by I in (1) of FIG. 12), the wavelength spectrum width of the DFF signal becomes greater (indicated by I in (2) of FIG. 12). In contrast, when the signal intensity of the amplified signal is decreased (indicated by III in (1) of FIG. 12), the wavelength spectrum width of the DFF signal becomes smaller (indicated by III in (2) of FIG. 12).

A flat wavelength spectrum as illustrated in (2) of FIG. 12 may be obtained in the dispersion flat fiber 146. By utilizing this dispersion flat fiber 146, since the intensity of the DFF signal will be substantially constant even there are fluctuations in intensity of the input signal, an influence of the fluctuations in intensity of the input signal can be suppressed and a noise component can be removed.

A time waveform of the amplified signal is illustrated in (3) of FIG. 12. Further, a time waveform of the wavelength-converted OOK signal S149, which is the output from the wavelength converter, is illustrated in (4) of FIG. 12. A noise component indicated by IV in (4) of FIG. 12 is not included in the time waveform of the wavelength-converted OOK signal S149 (see (4) of FIG. 12).

With these characteristics, the all-wavelength converter functions as an identifying circuit as well as the wavelength converter.

However, when a high-speed optical signal having a data rate of 40 Gbps or more is converted using the dispersion flat fiber, there is a tendency that a waveform shaping function is markedly degraded when the wavelength conversion amount is large.

In view of the above, in the DPSK signal regenerator disclosed in the document referred above, wavelength converters are connected in multiple stages, and at each of the wavelength converters, the wavelength conversion amount is adjusted to an extent such that the waveform shaping function is not degraded. Specifically, wavelength converters are connected in five stages in order to achieve wavelength conversion of 10 nm, wherein the wavelength shift amount in each of the wavelength converters is set to 2 nm.

Therefore, the DPSK signal regenerator is difficult in miniaturization, and further, is economically disadvantageous.

Moreover, if the data rate is increased, it is necessary to narrow the width of an optical pulse in proportion to a transmission rate. In this case, it is also necessary to decrease a dispersion value of the dispersion flat fiber. An appropriate dispersion value required for the dispersion flat fiber is proportional to the square of a pulse width, that is, is inversely proportional to the square of the data rate. As a consequence, if the data rate is increased four times from 40 Gbps to 160 Gbps, a dispersion value required for the dispersion flat fiber will be 1/16. This signifies that a dispersion value of −0.03 ps/nm/km, having a significantly small absolute value with respect to a dispersion value of −0.5 ps/nm/km in the fiber disclosed in the above-referred document, is required. However, fabrication of a dispersion flat fiber having a dispersion value having such small absolute value is difficult.

SUMMARY OF THE INVENTION

An object of the present invention is to provide a small-sized wavelength conversion device having a simple configuration and a wavelength conversion function with a wavelength shaping effect, and further, to provide a wavelength conversion method performed in the wavelength conversion device.

As the inventor earnestly studied, it has been found that a wavelength converting function with a wavelength shaping effect can be achieved by using two-stage wavelength converters, in which the direction of wavelength shifting in a first wavelength converter and the direction of wavelength shifting in a second wavelength converter is set to be opposite, and further, the magnitude of the wavelength shifting in the second wavelength converter is made to be greater than the magnitude of the wavelength shifting in the first wavelength converter. Further, it has been found that the second wavelength converter can be configured without including an optical amplifier by appropriately selecting a non-linear constant of a dispersion flat fiber used in the wavelength conversion.

One aspect of the present invention is a wavelength conversion device that performs a wavelength shift amount $\Delta\lambda$ of wavelength shifting with respect to an incident light beam, including a first wavelength converter and a second wavelength converter.

The first wavelength converter includes an optical amplifier, a first dispersion flat fiber, and a first wavelength filter, and shifts the center wavelength of an incident light beam by a first wavelength shift amount $\Delta\lambda_1$ to be the center wavelength of a first wavelength converted light beam. The optical amplifier amplifies the incident light beam to generate an amplified light beam, the first dispersion flat fiber spreads the wavelength spectrum width of the amplified light beam to generate a first fiber output light beam, and the first wavelength filter transmits a predetermined wavelength bandwidth of the first fiber output light beam and generates the first wavelength converted light beam.

The second wavelength converter is a wavelength converter configured without an optical amplifier, includes a second dispersion flat fiber and a second wavelength filter, and shifts the center wavelength of the first wavelength converted light beam by a second wavelength shift amount $\Delta\lambda_2$ to be the center wavelength of a second wavelength converted light beam. The second dispersion flat fiber spreads the wavelength spectrum width of the first wavelength converted light beam to generate a second fiber output light beam, and the second wavelength filter transmits a predetermined wavelength bandwidth of the second fiber output light beam and generates the second wavelength converted light beam.

The first wavelength shift amount $\Delta\lambda_1$ and the second wavelength shift amount $\Delta\lambda_2$ are set so as to satisfy the conditions: $\Delta\lambda_1 + \Delta\lambda_2 = \Delta\lambda$; $\Delta\lambda_1 \times \Delta\lambda_2 < 0$; and $|\Delta\lambda_1| < |\Delta\lambda_2|$.

In the above-described aspect, the second wavelength converter may include a variable optical attenuator. The variable optical attenuator attenuates the light intensity of the first wavelength converted light beam, and then transmits it to the second dispersion flat fiber.

In the above-described aspect, wavelength filters may be further provided at input and output sides of the optical amplifier.

A second aspect of the present invention is a wavelength conversion method that applies a wavelength shift amount $\Delta\lambda$ of wavelength shifting with respect to an incident light beam in the wavelength conversion device, and includes the following steps.

Firstly, the incident light beam is amplified in an optical amplifier to generate an amplified light beam. Next, the wavelength spectrum width of the amplified light beam is spread in a first dispersion flat fiber to generate a first fiber output light beam. Subsequently, the first fiber output light beam is allowed to transmit through a predetermined wavelength bandwidth in a first wavelength filter to generate a first wavelength converted light beam in which the center wavelength is shifted by a first wavelength shift amount $\Delta\lambda_1$ from the center wavelength of the incident light beam. Thereafter, the wavelength spectrum width of the first wavelength converted light beam is spread in a second dispersion flat fiber to generate a second fiber output light beam. And then, the second fiber output light beam is allowed to transmit through a predetermined wavelength bandwidth in a second wavelength filter to thus generate a second wavelength converted light beam in which the center wavelength is shifted by a second wavelength shift amount $\Delta\lambda_2$ from the center wavelength of the first wavelength converted light beam.

At this time, the first wavelength shift amount $\Delta\lambda_1$ and the second wavelength shift amount $\Delta\lambda_2$ are set so as to satisfy the conditions: $\Delta\lambda_1 + \Delta\lambda_2 = \Delta\lambda$; $\Delta\lambda_1 \times \Delta\lambda_2 < 0$; and $|\Delta\lambda_1| < |\Delta\lambda_2|$.

In the above-described aspect, the second dispersion flat fiber may spread the wavelength spectrum width of the first wavelength converted light beam, which has been attenuated in a variable optical attenuator, to generate the second fiber output light beam.

BRIEF DESCRIPTION OF THE DRAWINGS

Exemplary embodiments of the present invention will be described in detail based on the following figures, wherein.

DETAILED DESCRIPTION OF THE INVENTION

A detailed description will be given below of exemplary embodiments according to the present invention with reference to the attached drawings. The shape, size, and arrangement of each of the components are merely schematically illustrated to an extent that is enough to understand the invention. Further, as the exemplary embodiments according to the present invention will be described below, materials and numerical conditions of each of the components are merely examples. Accordingly, the present invention is not limited to the exemplary embodiments described below, and many variations and/or modifications are capable as far as the effect of the invention are achieved without departing from the scope of the invention.

Principle of Two-Stage Wavelength Conversion

Figure 1:
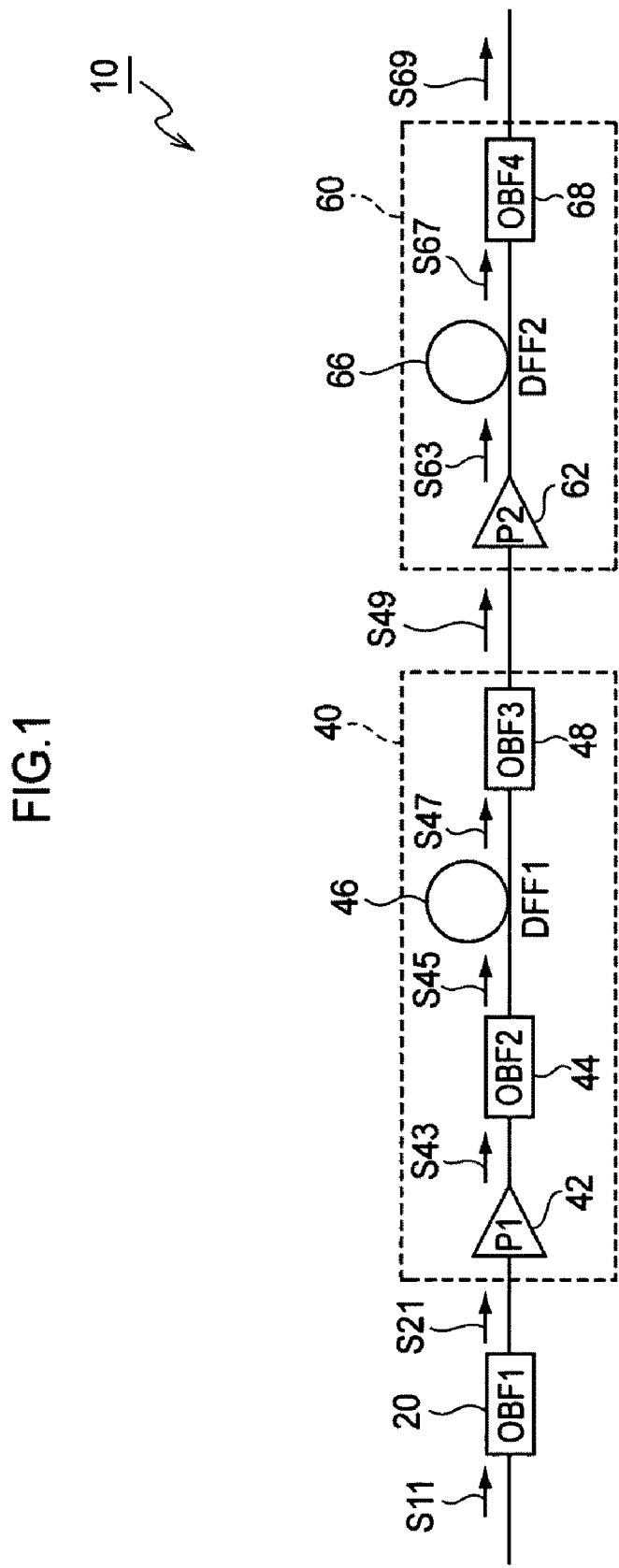
FIG. 1 is a schematic diagram illustrating a principle of two-stage wavelength conversion.

Referring to FIG. 1, a principle of two-stage wavelength conversion will be described. FIG. 1 is a schematic diagram illustrating the principle of the two-stage wavelength conversion.

An incident light beam (indicated by an arrow S11) into a wavelength conversion device 10 is given as a return-to-zero (RZ) signal having a transmission rate of 160 Gbps and a pulse width of 2.5 ps.

The wavelength conversion device 10 that performs the two-stage wavelength conversion includes a first wavelength converter 40 and a second wavelength converter 60. Moreover, the wavelength conversion device 10 has a first fore-stage wavelength filter (optical band-pass filter 1; OBF1) 20 at an input side of the first wavelength converter 40. The wavelength conversion device 10 performs an all-wavelength shift amount $\Delta\lambda$ of wavelength shifting with respect to the incident light beam.

The first wavelength converter 40 includes a first optical amplifier (P1) 42, a second fore-stage wavelength filter (OBF2) 44, a first dispersion flat fiber (DFF1) 46, and a first wavelength filter (OBF3) 48.

The second wavelength converter 60 includes a second optical amplifier (P2) 62, a second dispersion flat fiber (DFF2) 66, and a second wavelength filter (OBF4) 68.

The first fore-stage wavelength filter 20 and the second fore-stage wavelength filter 44 are disposed at an input terminal and an output terminal of the first optical amplifier 42, respectively, so as to remove an amplified spontaneous emission (ASE) noise included in the incident light beam S11.

Here, the first fore-stage wavelength filter 20 is a filter having a secondary super Gaussian shape with a transparent bandwidth (BW) of 3 nm. An m-order super Gaussian shape is expressed by a function: $f(t)=\exp\{-t^{(2m)}\}$.

Further, the second fore-stage wavelength filter 44 is a filter having a Gaussian shape with a transparent bandwidth (BW) of 3 nm.

The first optical amplifier 42 amplifies the incident light beam (indicated by an arrow S21) incident into the first wavelength converter 40 via the first fore-stage wavelength filter 20 to a desired light intensity, and generates a first amplified light beam (indicated by an arrow S43). The second fore-stage wavelength filter 44 removes an ASE noise which has been added at the time of the amplification at the first optical amplifier 42.

The first dispersion flat fiber (DFF1) 46 spreads the wavelength spectrum width of the first amplified light beam (indicated by an arrow S45) transmitted through the second fore-stage wavelength filter 44 using Spontaneous Phase Modulation (SPM) effect, and generates a first fiber output light beam (indicated by an arrow S47).

The first wavelength filter 48 transmits a predetermined wavelength bandwidth of the first fiber output light beam S47, and generates a first wavelength converted light beam (indicated by an arrow S49). Here, the first wavelength filter 48 is a filter having a Gaussian shape with a transparent bandwidth (BW) of 3 nm. A center wavelength $\lambda 1$ of the transparent bandwidth (BW) is varied by a first wavelength shift amount $\Delta\lambda 1$ ($=\lambda 1-\lambda 0$) from a center wavelength $\lambda 0$ of the incident light beam.

Figure 2:
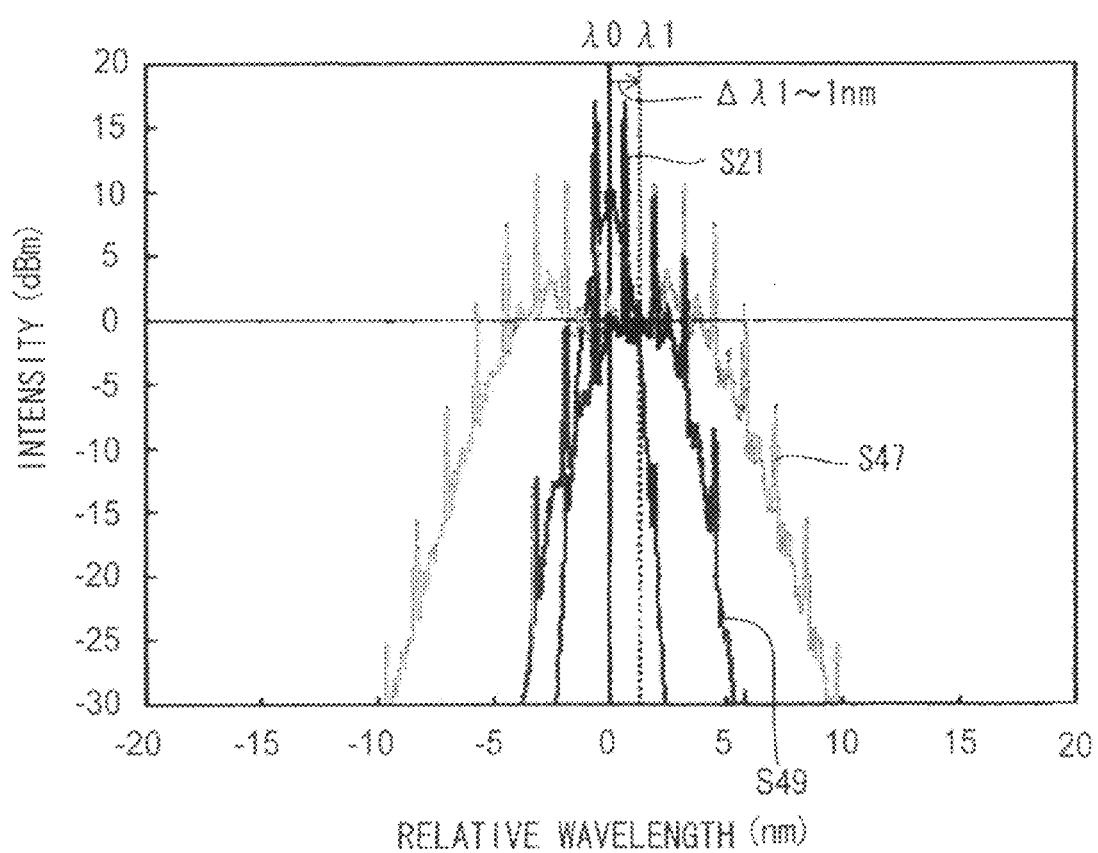
FIG. 2 is a graph illustrating a calculation result of wavelength spectra in a first wavelength converter.

Wavelength spectra in the first wavelength converter 40 will be described in reference with FIG. 2. FIG. 2 is a graph illustrating the calculation result of the wavelength spectra in the first wavelength converter 40. Here, the first dispersion flat fiber is designed to have a length of 1 km, a dispersion of −0.15 ps/nm/km, and a non-linear constant of 10 $km^{-1}W^{-1}$, and the output power of the first optical amplifier 42 is designed to be 23 dBm. In FIG. 2, the lateral axis indicates a relative wavelength (nm) with reference to the center wavelength $\lambda 0$ of the incident light beam S21 which is incident into the wavelength converter 40, and the vertical axis indicates a light intensity (dBm).

The first fiber output light beam S47 which is an output from the first dispersion flat fiber 46 has a greater wavelength spectrum width than that of the incident light beam S21. The center wavelength of the first fiber output light beam S47 substantially matches with that of the incident light beam.

Here, the first wavelength shift amount $\Delta\lambda 1$ is set to 1 nm, that is, the wavelength is shifted toward a longer wavelength than the center wavelength $\lambda 0$ of the incident light beam S21. In other words, the center wavelength $\lambda 1$ of the first wavelength filter 48 (the first wavelength converted light beam S49) is given by the equation: $\lambda 1 = \lambda 0 + 1$.

Figure 3A:
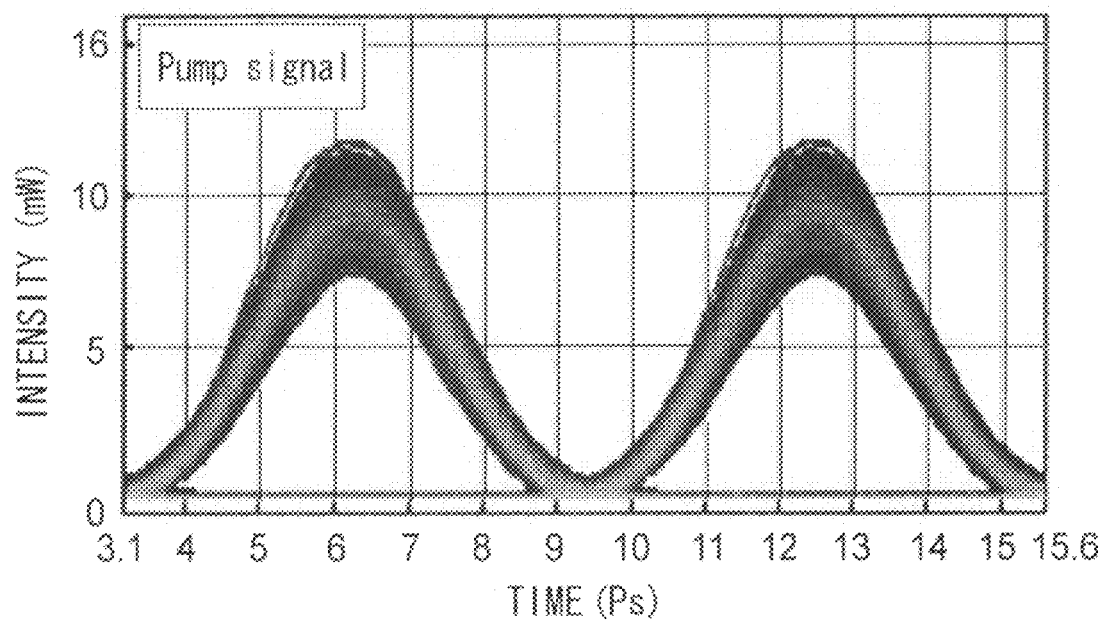
FIGS. 3A and 3B are graphs illustrating eye patterns of an incident light beam and a first wavelength converted light beam.
Figure 3B:
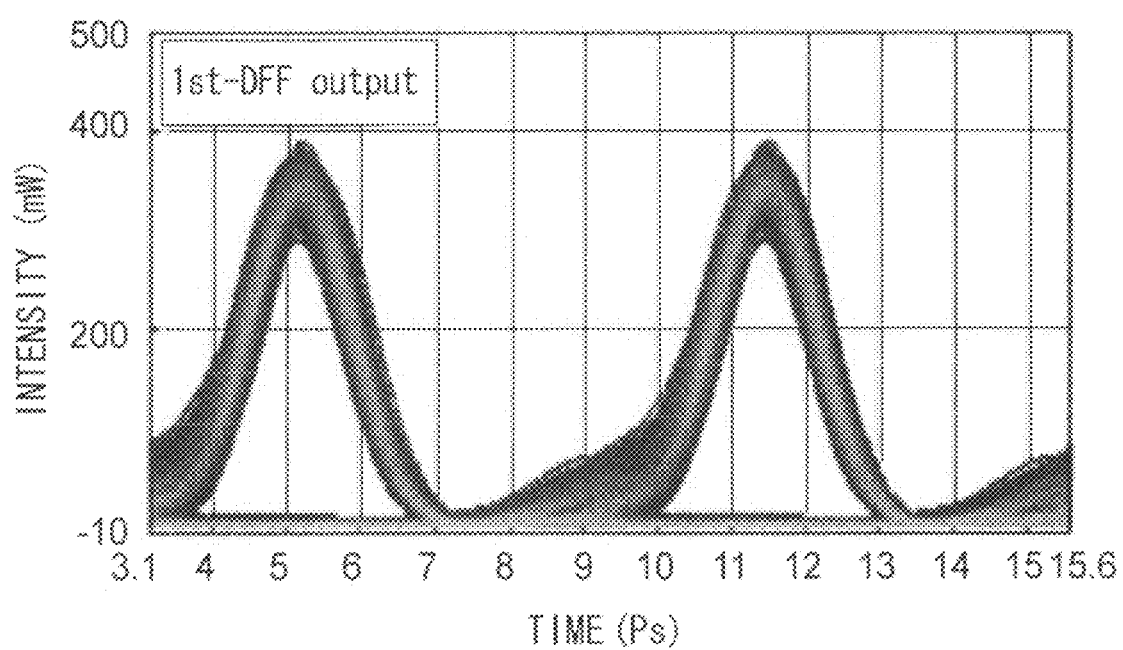

FIGS. 3A and 3B are graphs illustrating eye patterns of the incident light beam S21 and the first wavelength converted light beam S49. FIG. 3A illustrates an eye pattern of the incident light beam S21, and FIG. 3B illustrates an eye pattern of the first wavelength converted light beam S49.

Comparing FIGS. 3A and 3B, the first wavelength converted light beam S49 illustrated in FIG. 3B shows an asymmetric shape but a narrower pulse width in comparison with the incident light beam S21 illustrated in FIG. 3A.

Since the pulse width is narrowed, the second wavelength converter 60 can obtain a wavelength converted light beam more efficiently, and in an improved quality. For example, in a case in which the data rate is 160 Gbps and the pulse width of the incident light beam is 2 to 3 ps, the pulse width of the first wavelength converted light beam S49 is set to 1 to 1.5 ps.

The second light amplifier 62 amplifies the first wavelength converted light beam S49 incident into the second wavelength converter 60 to a desired light intensity, and generates a second amplified light beam (indicated by an arrow S63). The second dispersion flat fiber 66 spreads the wavelength spectrum width of the second amplified light beam S63 using the Spontaneous Phase Modulation (SPM) effect, and generates a second fiber output light beam (indicated by an arrow S67).

The second wavelength filter 68 transmits a predetermined wavelength bandwidth of the second fiber output light beam S67, and generates a second wavelength converted light beam (indicated by an arrow S69). Here, the second wavelength filter 68 is a filter having a Gaussian shape with a transparent bandwidth (BW) of 1.3 nm.

A center wavelength $\lambda 2$ of the transparent bandwidth (BW) is varied by a second wavelength shift amount $\Delta\lambda 2$ ($=\lambda 2-\lambda 1$) from the center wavelength $\lambda 1$ of the first wavelength converted light beam S49.

The wavelength conversion device 10 achieves the all-wavelength shift amount Δλ of wavelength shifting using two stages of the first wavelength converter 40 and the second wavelength converter 60. Namely, Δλ1+Δλ2=Δλ.

Further, either one of the first wavelength shift amount Δλ1 and the second wavelength shift amount Δλ2 is set to be positive, and the other is set to be negative, so that they satisfy Δλ1×Δλ2<0. In this exemplary embodiment, the first wavelength shift amount Δλ1 is positive (Δλ1>0), that is, the wavelength is shifted toward a longer wavelength. Therefore, the second wavelength shift amount Δλ2 is set to negative (Δλ2<0), that is, the wavelength is shifted toward a shorter wavelength. Moreover, the magnitude (|Δλ2|) of the wavelength shift in the second wavelength converter 60 is set to be greater than the magnitude (|Δλ1|) of the wavelength shift in the first wavelength converter (i.e., |Δλ1|<|Δλ2|).

Figure 4:
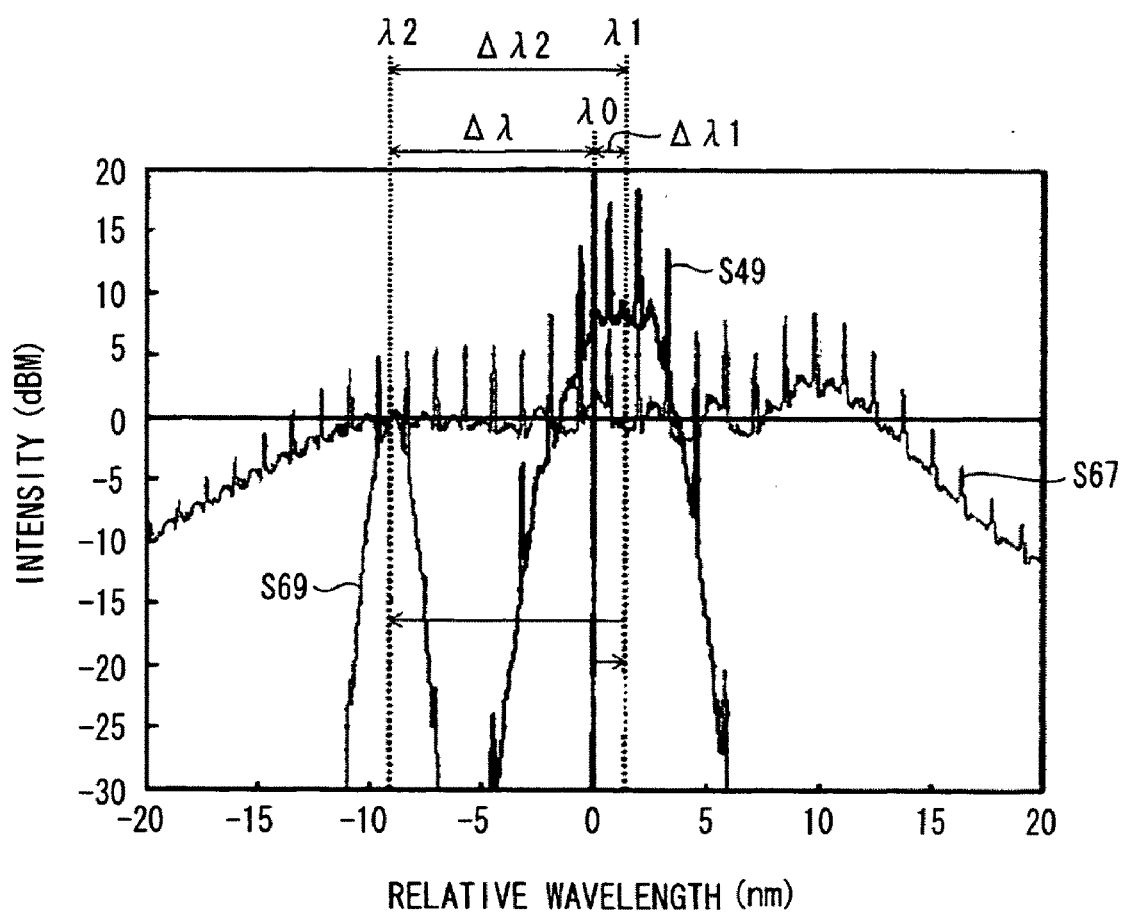
FIG. 4 is a graph illustrating a calculation result of wavelength spectra in a second wavelength converter.

Referring to FIG. 4, explanation will be made on wavelength spectra in the second wavelength converter 60. FIG. 4 is a graph illustrating a calculation result of the wavelength spectra in the second wavelength converter 60. Here, the second dispersion flat fiber 66 has the same configuration as that of the first dispersion flat fiber 46, and the output power of the second light amplifier 62 is set to 26 dBm. In FIG. 4, the lateral axis indicates a relative wavelength (nm) with reference to the center wavelength λ0 of the incident light beam S21 which is incident into the first wavelength converter 40, and the vertical axis indicates a light intensity (dBm). Further, the second wavelength filter has the Gaussian shape with a bandwidth of 1.3 nm such that the pulse width of an incident light beam of 160 Gbps will be substantially identical to the the pulse width of the second wavelength converted light beam S69.

The second fiber output light beam S67 which is an output from the second dispersion flat fiber 66 has a greater wavelength spectrum width than that of the first wavelength converted light beam S49. The spectrum shape of the second fiber output light beam S67 is asymmetric due to reflection of the asymmetry of the incident first wavelength converted light beam S49. It is found from the wavelength spectrum of the second fiber output light beam S67 that a waveform becomes remarkably excellent in flatness in a negative region of a relative wavelength, that is, a wavelength region (on a shorter wavelength side) opposite to a wavelength shift direction (on a longer wavelength side) in the first wavelength converter 40. The intensity (dBm) largely fluctuates in the longer wavelength side (on a side of positive relative wavelength) in the spectrum illustrated in FIG. 4. In contrast, the intensity fluctuation is small in the shorter wavelength side (on a side of negative relative wavelength), and the flat shape is achieved at least up to the relative wavelength of about −10 nm.

This shows that by setting the center wavelength λ2 of the second wavelength filter 68 to satisfy the condition of Δλ1×Δλ2<0, the second wavelength converted light beam S69 can be obtained in an improved quality. Moreover, since the second wavelength shift amount Δλ2 is greater than the first wavelength shift amount Δλ1, efficient wavelength conversion can be achieved.

Accordingly, the two-stage wavelength conversion in which Δλ1=1 nm and Δλ2=−10 nm entirely enables the wavelength shifting by Δλ=Δλ1+Δλ2=−9 nm.

Figure 5A:
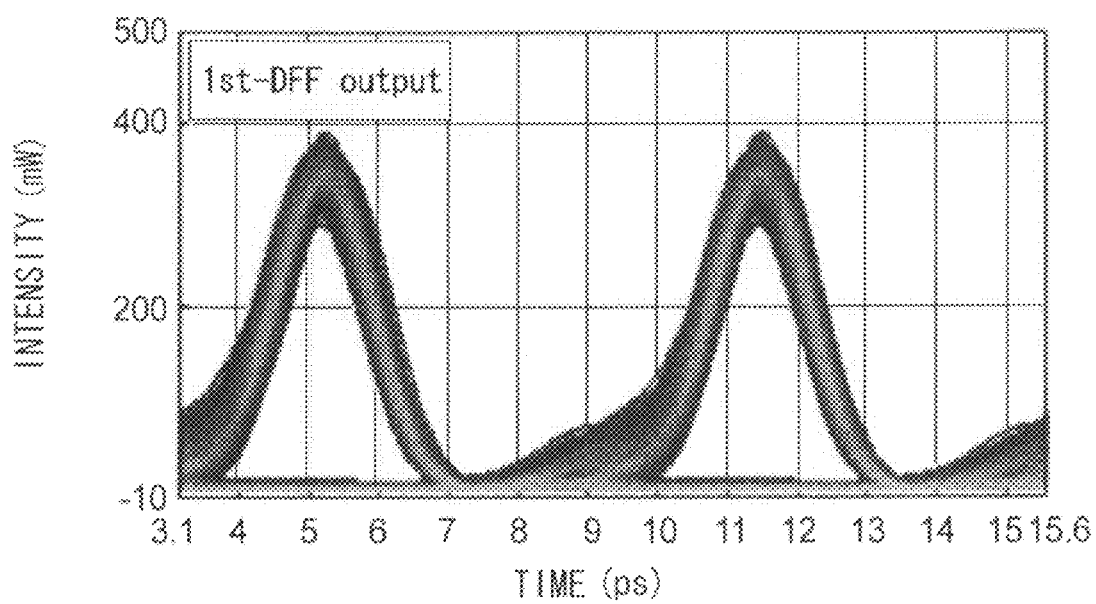
FIGS. 5A and 5B are graphs illustrating eye patterns of the first wavelength converted light beam and a second wavelength converted light beam.
Figure 5B:
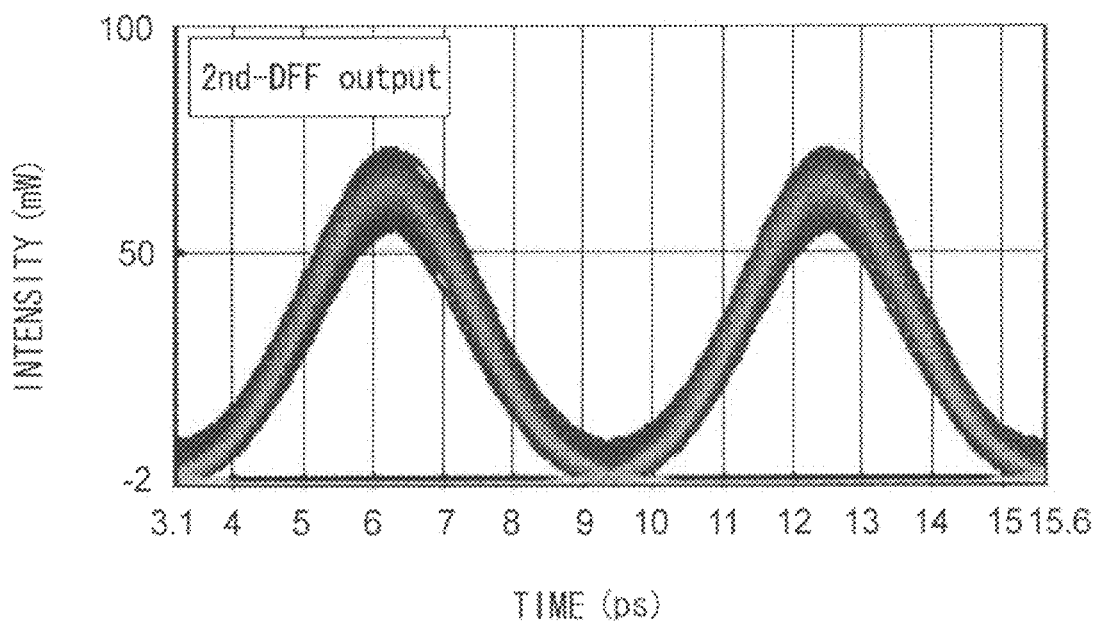

FIGS. 5A and 5B are graphs illustrating eye patterns of the first wavelength converted light beam and the second wavelength converted light beam. FIG. 5A illustrates an eye pattern of the first wavelength converted light beam S49 and FIG. 5B illustrates an eye pattern of the second wavelength converted light beam S69.

The second wavelength converted light beam S69 is not degraded in wavelength, and exhibits an excellent eye aperture. As a consequence, when the data rate is 160 Gbps, an excellent waveform shaping effect is achieved even when the dispersion value of the dispersion flat fiber is about −0.15 ps.

In general, the non-linear optical effect in the dispersion flat fiber (DFF) is standardized by the product of the length L of the DFF, a non-linear constant γ, and a peak power P of an optical signal of an incident light beam without taking into consideration the propagation loss of the fiber and an influence of dispersion.

For example, assumed that the first and second dispersion flat fibers have a length of 1 km, a dispersion of −0.15 ps/nm/km, and a non-linear constant of 10 km$^{-1}$W$^{-1}$, the light intensity of the light beam incident into the first dispersion flat fiber 46 is set to 23 dBm so that the wavelength shift Δλ1 in the first wavelength converter 40 will be 1 nm. Further, the light intensity of the light beam incident into the second dispersion flat fiber 66 is set to 26 dBm so that the wavelength shift Δλ2 in the second wavelength converter 60 will be −10 nm.

In the wavelength conversion device illustrated in FIG. 1, the first light amplifier 42 and the second light amplifier 62 are arranged at the preceding stage of the first and second dispersion flat fibers 46 and 66, respectively, such that the light intensities of the light beams incident into the first and second dispersion flat fibers 46 and 66 are 23 set to dBm and 26 dBm, respectively.

EXEMPLARY EMBODIMENT

Figure 6:
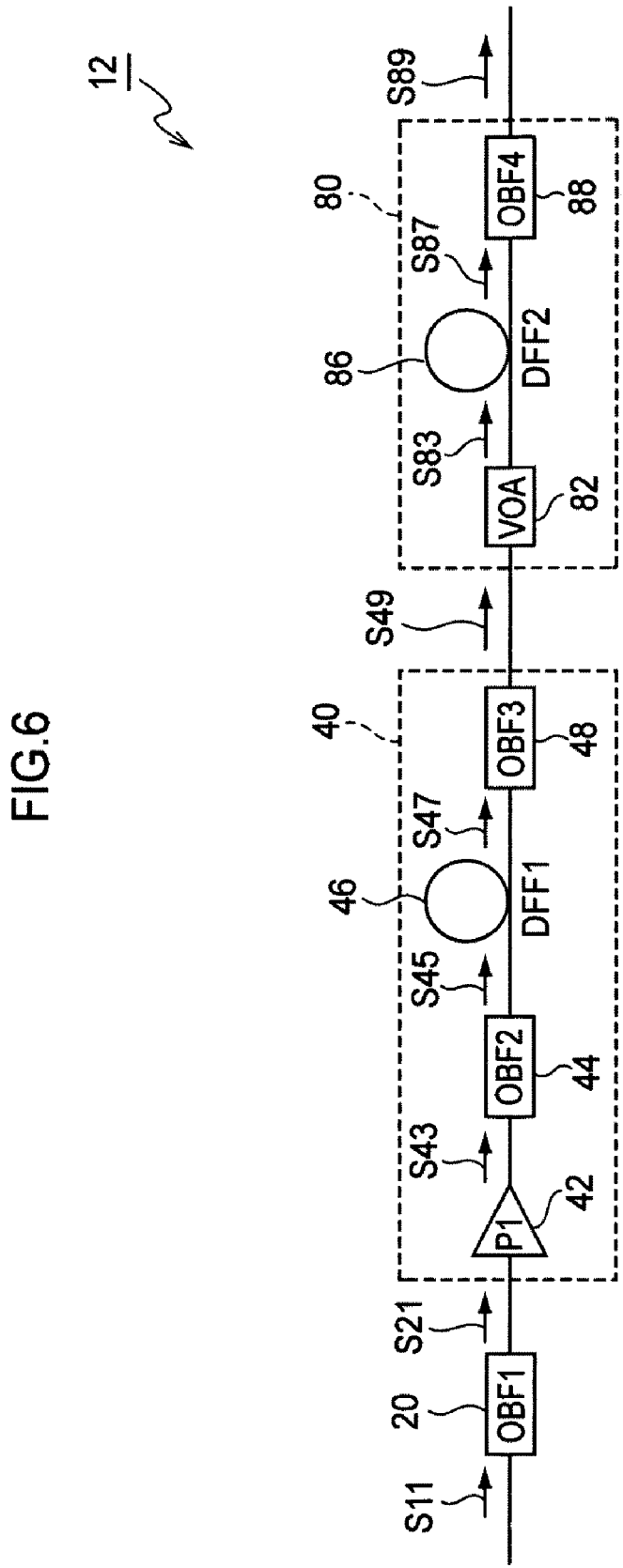
FIG. 6 is a schematic diagram illustrating a wavelength conversion device.

An exemplary wavelength conversion device will be described in reference with FIG. 6. FIG. 6 is a schematic diagram illustrating one exemplary embodiment of the wavelength conversion device.

A general erbium-doped optical fiber amplifier (EDFA) which serves as an optical amplifier includes one or more excitation light sources and their drive circuits, one or more isolators, and an erbium-doped optical fiber having a length of several tens m that serves as a gain medium. Since there is a limitation for miniaturization of an optical amplifier, in order to miniaturize a wavelength conversion device, reduction of the number of optical amplifiers provided therein is effective.

In view of this, the wavelength conversion device in the exemplary embodiment is configured to exclude an optical amplifier from the second wavelength converter.

A wavelength conversion device 12 includes the first wavelength converter 40 and a second wavelength converter 80. Moreover, the wavelength conversion device 12 is provided with the first fore-stage wavelength filter OBF1 20 on an input side of the first wavelength converter 40. The wavelength conversion device 12 performs an all-wavelength shift amount Δλ of wavelength shifting with respect to the incident light beam.

Here, the light beam (indicated by an arrow S11) incident into the wavelength conversion device 12 is an RZ signal having a transmission rate of 160 Gbps and a pulse width of 2.5 ps.

The first wavelength converter 40 includes the first optical amplifier (hereinafter simply referred to as "the optical amplifier") 42, the second fore-stage wavelength filter (OBF2) 44, the first dispersion flat fiber (DFF1) 46, and the first wavelength filter (OBF3) 48.

The second wavelength converter 80 includes a variable optical attenuator 82 (VOA), a second dispersion flat fiber (DFF2) 86, and a second wavelength filter (OBF4) 88.

The first fore-stage wavelength filter 20 and the second fore-stage wavelength filter 44 are disposed at an input terminal and an output terminal of the optical amplifier 42, respectively, so as to remove an amplified spontaneous emission (ASE) noise included in the incident light beam S11.

Here, the first fore-stage wavelength filter 20 is a filter having a secondary super Gaussian shape with a transparent bandwidth (BW) of 3 nm. Further, the second fore-stage wavelength filter 44 is a filter having a Gaussian shape with a transparent bandwidth (BW) of 3 nm.

The optical amplifier 42 amplifies an incident light beam (indicated by an arrow S21) incident into the first wavelength converter 40 via the first fore-stage wavelength filter 20 to a desired light intensity, and generates a first amplified light beam (indicated by an arrow S43). The second fore-stage wavelength filter 44 removes an ASE noise which has been added at the time of the amplification at the optical amplifier 42.

The first dispersion flat fiber (DFF1) 46 spreads the wavelength spectrum width of the first amplified light beam (indicated by an arrow S45) transmitted through the second fore-stage wavelength filter 44 using the effect of spontaneous phase modulation (SPM), and generates a first fiber output light beam (indicated by an arrow S47).

The first wavelength filter 48 transmits a predetermined wavelength bandwidth of the first fiber output light beam S47, and generates a first wavelength converted light beam (indicated by an arrow S49). Here, the first wavelength filter 48 is a filter having a Gaussian shape with a transparent bandwidth (BW) of 3 nm. A center wavelength $\lambda 1$ of the transparent bandwidth (BW) is varied by a first wavelength shift amount $\Delta\lambda 1$ (=$\lambda 1-\lambda 0$) from a center wavelength $\lambda 0$ of the incident light beam.

Here, the first wavelength shift amount $\Delta\lambda 1$ is set to 1 nm, and the wavelength is shifted toward a longer wavelength from the center wavelength $\lambda 0$ of the incident light beam S21. In other words, the center wavelength $\lambda 1$ of the first wavelength filter 48 (the first wavelength converted light beam S49) is given by the equation: $\lambda 1=\lambda 0+1$.

The variable optical attenuator (VOA) 82 attenuates the light intensity of the first wavelength converted light beam to an intensity suitable for a non-linear optical effect in the second dispersion flat fiber, and generates a variably attenuated light beam (indicated by an arrow S83), and then, sends the variably attenuated light beam to the second dispersion flat fiber 86. When the light intensity of the first wavelength converted light beam need not be attenuated, the attenuation amount in the variable optical attenuator 82 may be set to zero. Alternatively, the variable optical attenuator 82 may be omitted.

The second dispersion flat fiber 86 spreads the wavelength spectrum width of the variably attenuated light beam S83 using the spontaneous phase modulation (SPM) effect, and generates a second fiber output light beam (indicated by an arrow S87).

The second wavelength filter 88 transmits a predetermined wavelength bandwidth of the second fiber output light beam S87, and generates a second wavelength converted light beam (indicated by an arrow S89). Here, the second wavelength filter 88 is a filter having a Gaussian shape with a transparent bandwidth (BW) of 1.3 nm.

Further, a center wavelength $\lambda 2$ of the transparent bandwidth (BW) is varied by a second wavelength shift amount $\Delta\lambda 2$ (=$\lambda 2-\lambda 1$) from the center wavelength $\lambda 1$ of the first wavelength converted light beam S49.

The wavelength conversion device 12 achieves a wavelength shifting corresponding to the all-wavelength shift amount $\Delta\lambda$ by using the first wavelength converter 40 and the second wavelength converter 80 in the two stages. Namely, $\Delta\lambda 1+\Delta\lambda 2=\Delta\lambda$.

Further, either one of the first wavelength shift amount $\Delta\lambda 1$ and the second wavelength shift amount $\Delta\lambda 2$ is set to be positive, and the other is set to be negative, while satisfying $\Delta\lambda 1\times\Delta\lambda 2<0$. In the present exemplary embodiment, the first wavelength shift amount $\Delta\lambda 1$ is set to positive ($\Delta\lambda 1>0$), that is, the wavelength is shifted toward a longer wavelength. Therefore, the second wavelength shift amount $\Delta\lambda 2$ is set to negative ($\Delta\lambda 2<0$), that is, the wavelength is shifted toward a shorter wavelength. Moreover, the magnitude ($|\Delta\lambda 2|$) of the wavelength shifting in the second wavelength converter 80 is set greater than the magnitude ($|\Delta\lambda 1|$) of the wavelength shifting in the first wavelength converter 40 (i.e., $|\Delta\lambda 1|<|\Delta\lambda 2|$).

The two-stage wavelength conversion with $\Delta\lambda 1=1$ nm and $\Delta\lambda 2=-10$ nm entirely enables the wavelength shifting by $\Delta\lambda=\Delta\lambda 1+\Delta\lambda 2=-9$ nm.

As described above, the first wavelength shift amount $\Delta\lambda 1$ in the first wavelength converter and the second wavelength shift amount $\Delta\lambda 2$ in the second wavelength converter in the wavelength conversion device in the exemplary embodiment are set to satisfy $\Delta\lambda 1\times\Delta\lambda 2<0$ and $|\Delta\lambda 1|<|\Delta\lambda 2|$.

In this manner, the second fiber output light beam may obtain excellent flatness in its waveform in a wavelength region opposite to the wavelength shift direction in the first wavelength conversion. Since the second wavelength filter transmits the region having excellent flatness of the second fiber output light beam, a wavelength converted light beam can be obtained in an improved quality.

In addition, since the waveform has excellent flatness in the wavelength region opposite to the wavelength shift direction in the first wavelength conversion, the second wavelength shift amount $\Delta\lambda 2$ can be increased. As a consequence, for example, 10 nm of wavelength shifting can be performed by the two-stage wavelength conversion, rather than a wavelength conversion in five stages performed in the prior art.

Moreover, since the two-stage wavelength conversion is performed using a single optical amplifier, device can be miniaturized and power consumption can be saved.

The above-described exemplary embodiment is merely one example, and the invention is not limited to these conditions. For example, the shapes and widths of the first and second fore-stage wavelength filters and transmission bandwidths of the first and second wavelength filters may be arbitrarily and suitably set according to the width or the like of the optical pulse to be input. The first and second wavelength shift amounts may be suitably selected according to the desired wavelength shift amount $\Delta\lambda$ as long as the conditions $\Delta\lambda 1+\Delta\lambda 2<\Delta\lambda$, $\Delta\lambda 1\times\Delta\lambda 2<0$, and $|\Delta\lambda 1|<|\Delta\lambda 2|$ are satisfied.

The variable optical attenuator 82 has a rectangular parallelepiped main body having a longest side of 5 to 6 cm or less, and a pigtailed fiber serving as an input/output interface is fixed thereto. The variable optical attenuator is smaller than a general EDFA, and the volume of the variable optical attenuator may be 5% or less of that of the general EDFA. Therefore, even if the variable optical attenuator is includes in the second wavelength converter, an influence on the size of the wavelength conversion device can be ignored.

First Exemplary Embodiment

When the first and second dispersion flat fibers 46 and 86 have a length of 1 km, a dispersion of −0.15 ps/nm/km, and a non-linear constant of 10 $km^{-1}\,W^{-1}$, in order to achieve the wavelength shift $\Delta\lambda 1=1$ nm in the first wavelength converter 40, the light intensity of the optical signal incident into the first dispersion flat fiber 46 may be set to 23 dBm by using the optical amplifier 42. On the other hand, in order to achieve the wavelength shift $\Delta\lambda 2 = -10$ nm in the second wavelength converter 80, the light intensity of the light beam incident into the second dispersion flat fiber 86 is required to be 26 dBm. However, when the light intensity of the optical signal incident into the first dispersion flat fiber 46 is 23 dBm, the light intensity of the first wavelength converted light beam S49 is about 17 dBm, which is smaller by about 9 dB than the light intensity required as an input into the second dispersion flat fiber. That is, the light intensity of the first wavelength converted light beam S49 is about ⅛ of the required light intensity.

The extent of the non-linear optical effect is standardized by the product of the length L, the non-linear constant $\gamma$, and the peak power P0 of the optical signal to be input.

Hence, a fiber having a length L of 1 km and a non-linear constant $\gamma$ of 80 km$^{-1}$ W$^{-1}$, which is eight times that of the first dispersion flat fiber 46, is prepared to serve as the second dispersion flat fiber. When the light beam having a light intensity of 17 dBm is incident into the dispersion flat fiber having the length L of 1 km and the non-linear constant $\gamma$ of 80 km$^{-1}$ W$^{-1}$, the same non-linear optical effect as that in a case in which the light beam of 26 dBm is input into a dispersion flat fiber having a non-linear constant $\gamma$ of 10 km$^{-1}$ W$^{-1}$ can be obtained.

Figure 7A:
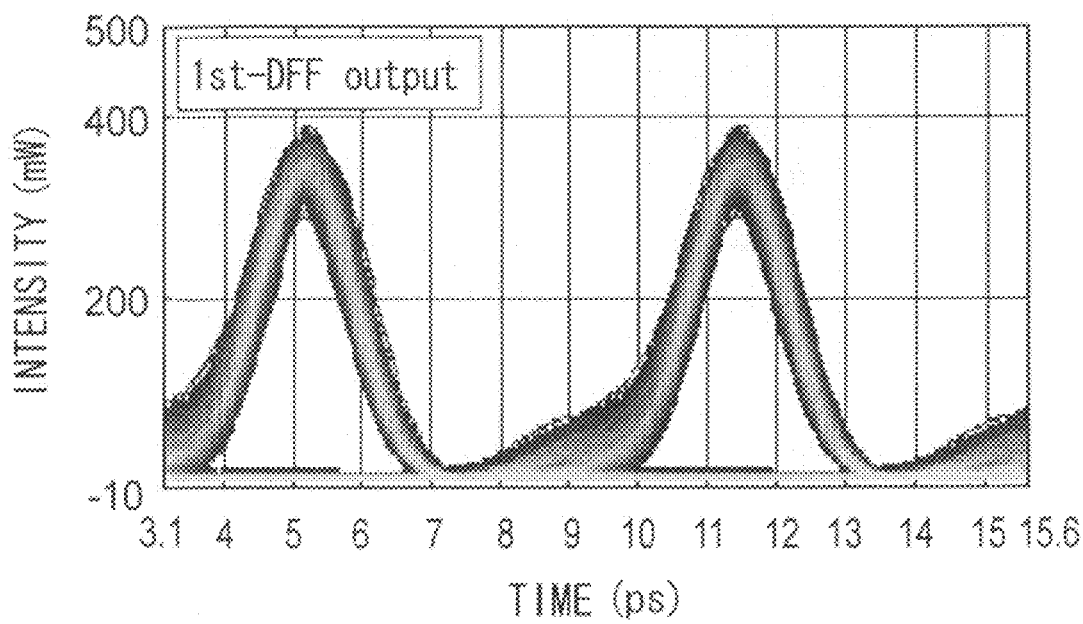
FIGS. 7A and 7B are graphs illustrating eye patterns of the first and second wavelength converted light beams in a first exemplary embodiment.
Figure 7B:
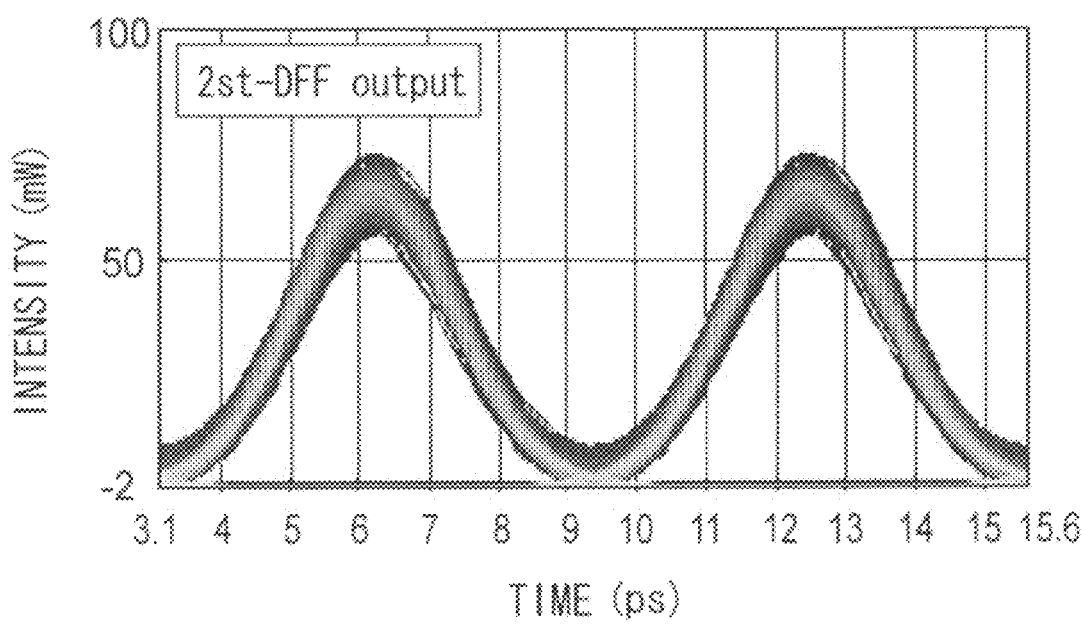

FIG. 7A is a graph illustrating the eye pattern of the first wavelength converted light beam S49 and FIG. 7B is a graph illustrating the eye pattern of the second wavelength converted light beam S89. Here, the attenuation amount in the variable optical attenuator 82 is zero. As illustrated in FIG. 7B, the second wavelength converted light beam S89 is not degraded in waveform, and exhibits an excellent eye aperture. In this manner, in the case where the data rate is 160 Gbps, the second wavelength converted light beam S89 exhibits an excellent waveform shaping effect even if the dispersion value of the dispersion flat fiber is about −0.15 ps.

Second Exemplary Embodiment

There may be a case that it is difficult to optimize the non-linear constant $\gamma$ of the second dispersion flat fiber according to the characteristics of the first wavelength converter. In this case, the light intensity of the first wavelength converted light beam is attenuated to a desired value by a variable optical attenuator, and then transmitted to the second dispersion flat fiber.

A fiber having a non-linear constant $\gamma$ of greater than 80 km$^{-1}$ W$^{-1}$, for example, a non-linear constant $\gamma$ of 100 km$^{-1}$ W$^{-1}$ is selected as the second dispersion flat fiber 86.

Here, when the first wavelength converter 40 is configured in the same manner as in the first exemplary embodiment, the light intensity of the first wavelength converted light beam is about 17 dBm, which is greater by about 1 dB than the light intensity that can obtain the desired non-linear optical effect in the second dispersion flat fiber 86. Therefore, the variable optical attenuator 82 attenuates the light intensity of the first wavelength converted light beam by about 1 dB so that the light intensity is adjusted to an optimum light intensity.

In this manner, by arranging the variable optical attenuator 82 at a preceding stage of the second dispersion flat fiber 86, it is possible to optimize the light intensity of the light beam incident into the second dispersion flat fiber 86 even if it is difficult to optimize the non-linear constant of the second dispersion flat fiber 86.

The non-linear optical effect in the dispersion flat fiber is standardized by the product of the length L of the fiber, the non-linear constant $\gamma$, and the peak power P of the optical signal to be input without taking into consideration the propagation loss of a fiber and an influence of dispersion. Therefore, when the optical intensities of the optical signals to be input are identical with each other, the non-linear optical effect can be standardized by the product of the non-linear constant $\gamma$ and the length L of the fiber. Accordingly, if it is difficult to prepare a dispersion flat fiber having a desired non-linear constant $\gamma$, such as 100 km$^{-1}$ W$^{-1}$ herein, the length L may be increased.

For example, a dispersion flat fiber having a length L of 1 km and a non-linear constant $\gamma$ of 100 km$^{-1}$ W$^{-1}$ and a dispersion flat fiber having a length L of 2 km and a non-linear constant $\gamma$ of 50 km$^{-1}$ W$^{-1}$ provide a similar non-linear optical effect.

When the length L of the dispersion flat fiber is doubled, the wavelength dispersion D is needed to be halved in order to maintain the same interaction between dispersion and the non-linear optical effect (SPM-GVD effect). In this case, the second dispersion flat fiber may have a length L of 2 km, a wavelength dispersion D of −0.075 ps/nm/km, and a non-linear constant $\gamma$ of 50 km$^{-1}$ W$^{-1}$.

Further, by decreasing the length L of the first dispersion flat fiber, the light intensity required for the first wavelength conversion can be increased by utilizing the fact that the non-linear optical effect of the dispersion flat fiber is standardized by the product of the non-linear constant $\gamma$, the length L, and the peak power P. For example, when that the length L of the first dispersion flat fiber is 0.5 km, the light intensity required for the first wavelength conversion is doubled, i.e., about 26 dBm. As a result, the light intensity of the first wavelength converted light beam will be greater, and, for example, a fiber having a small non-linear constant $\gamma$ may be used as the second dispersion flat fiber. Here, when the length of the first dispersion flat fiber is halved, the wavelength dispersion D is also need to be doubled in order to maintain the same SPM-GVD effect.

Hence, a fiber having a non-linear constant $\gamma 1$ of 10 km$^{-1}$ W$^{-1}$, a length L1 of 0.375 km, and a dispersion D1 of −0.4 ps/nm/km is selected as a first dispersion flat fiber. Further, a fiber having a non-linear constant $\gamma 2$ of 35 km$^{-1}$ W$^{-1}$, a length L2 of 1 km, and a dispersion D2 of −0.15 ps/nm/km is selected as a second dispersion flat fiber.

The intensity of an optical signal, which is amplified by the optical amplifier and is input into the first dispersion flat fiber, is set to be 27 dBm and an attenuation amount in the variable optical attenuator is set to be 1 dB. Eye patters in this case are illustrated in FIGS. 8A and 8B.

Figure 8A:
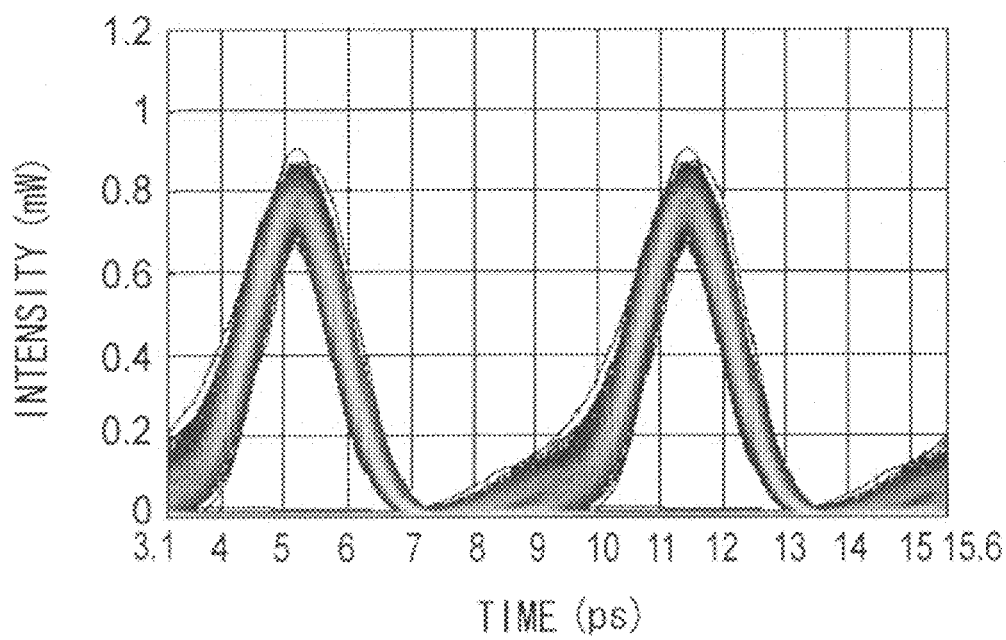
FIGS. 8A and 8B are graphs illustrating eye patterns of the first and second wavelength converted light beams in a second exemplary embodiment.
Figure 8B:
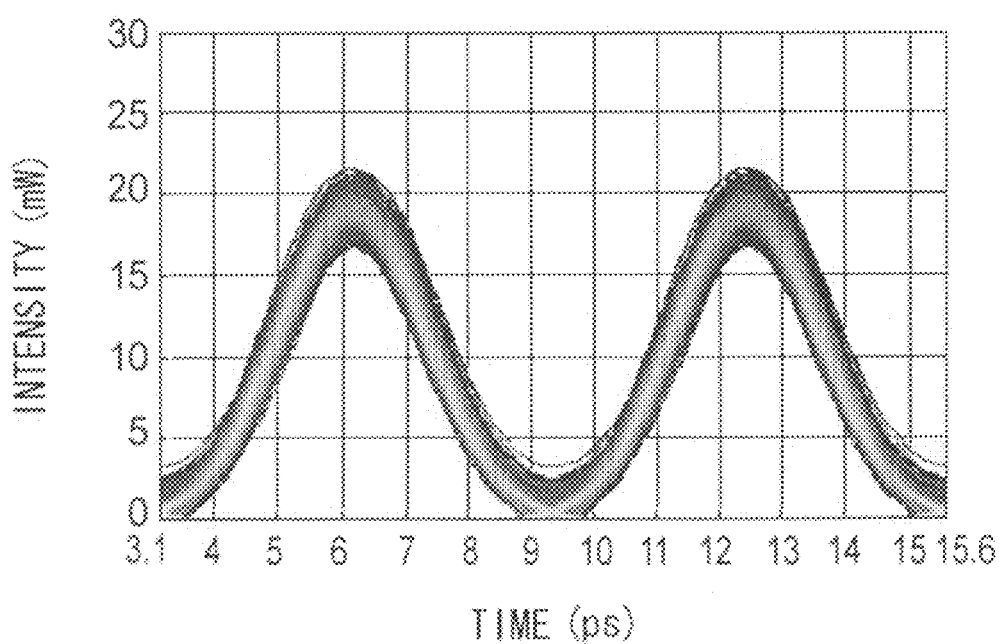
Figure 9:
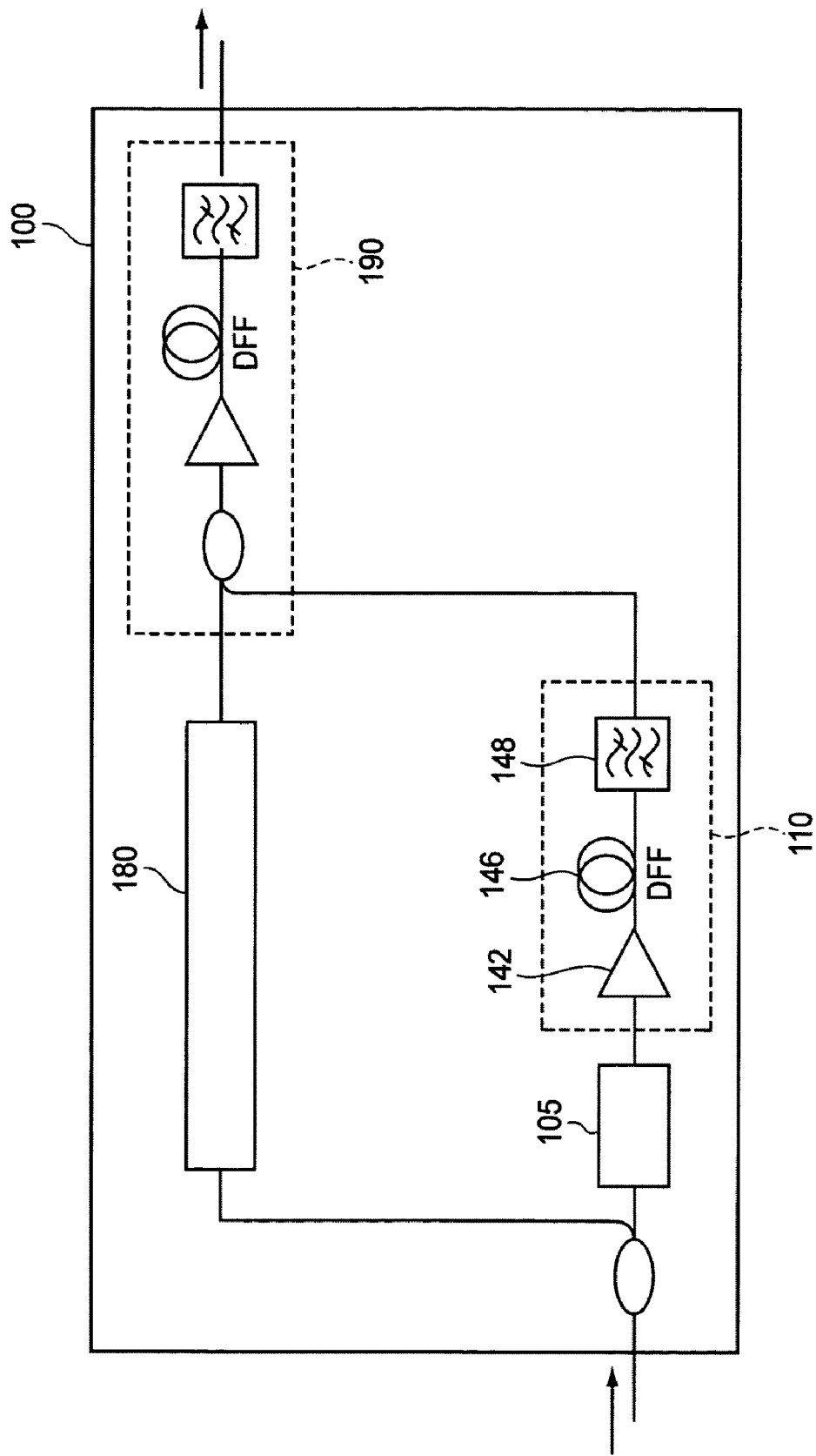
FIG. 9 is a schematic diagram illustrating a DPSK signal regenerator of a conventional art.
Figure 10:
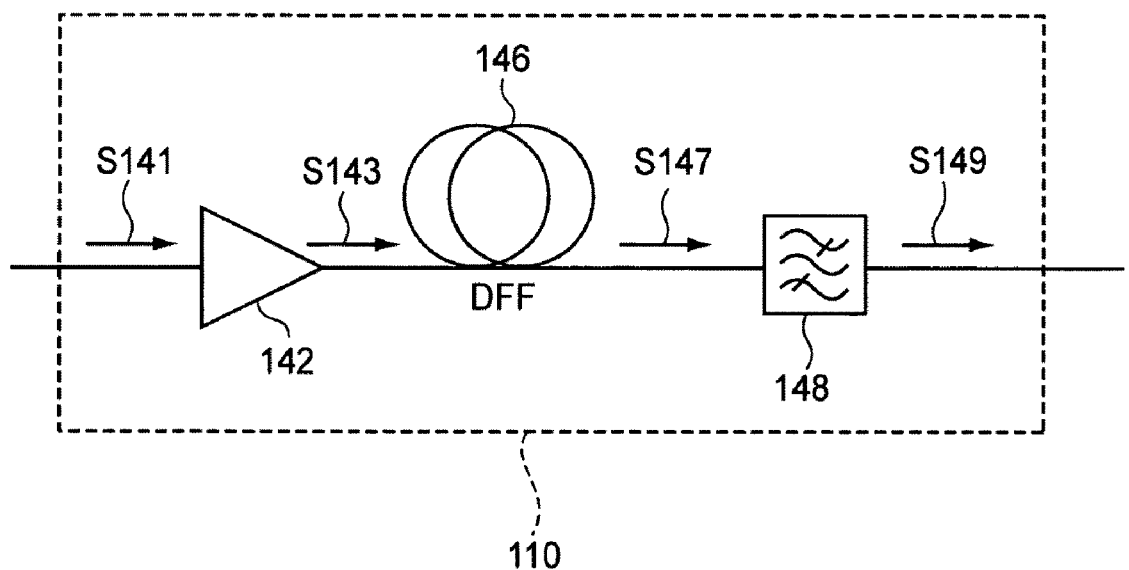
FIG. 10 is a diagram schematically illustrating the configuration of an all-optical wavelength converter.
Figure 11:
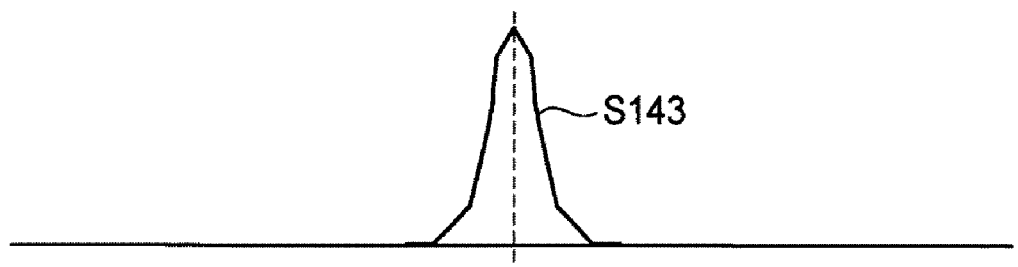
FIG. 11 illustrates a wavelength conversion in the all-optical wavelength converter.
Figure 11:
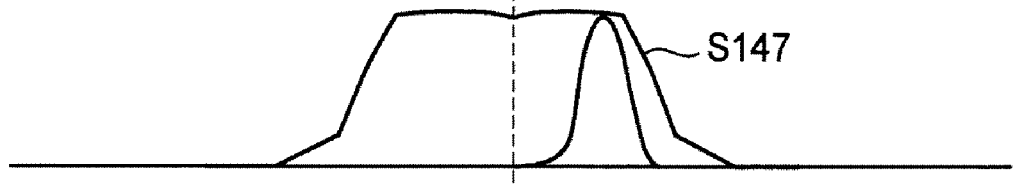
Figure 11:
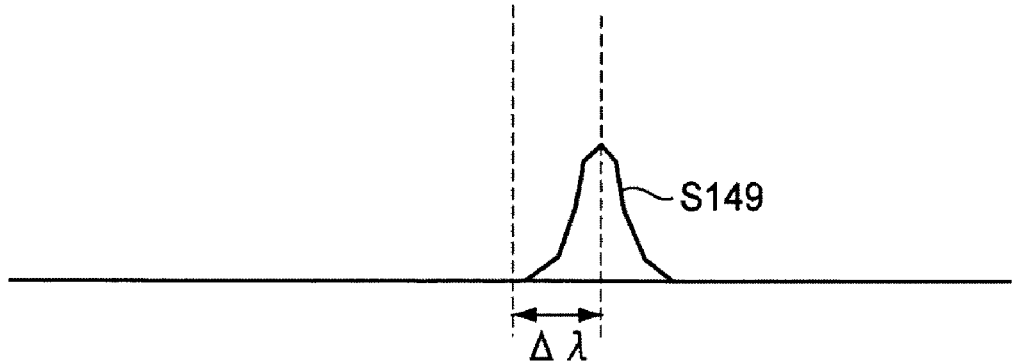
Figure 12:
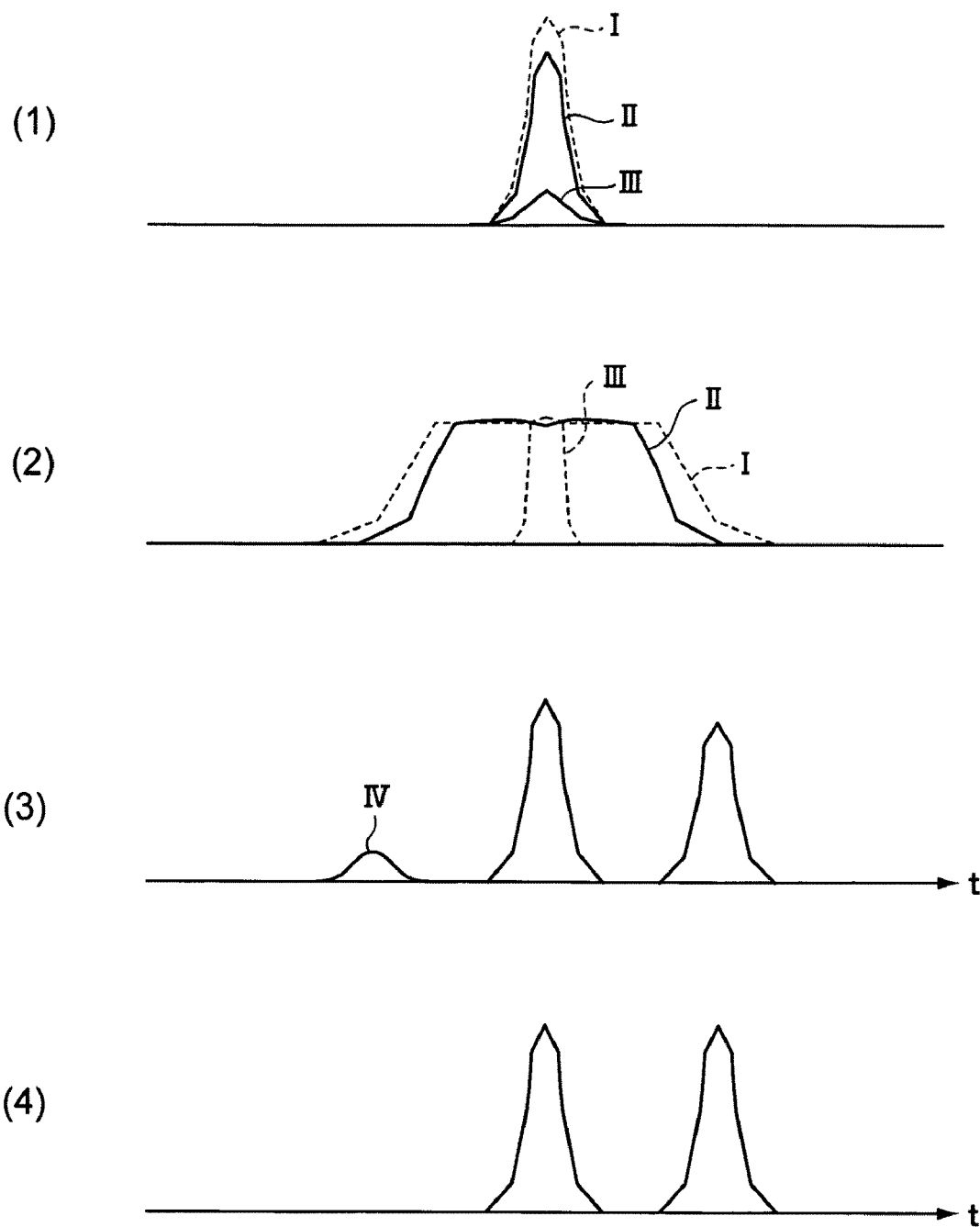
FIG. 12 illustrates a wavelength conversion in the all-optical wavelength converter.

FIG. 8A is a graph illustrating an eye pattern of the first wavelength converted light beam S49 and FIG. 8B is a graph illustrating an eye pattern of the second wavelength converted light beam S89. As illustrated in FIGS. 8A and 8B, the second wavelength converted light beam S89 is not degraded in wavelength, and exhibits an excellent eye aperture.

As described above, in the wavelength conversion device and the wavelength conversion method according to the aspects of the present invention, the first wavelength shift amount $\Delta\lambda 1$ in the first wavelength converter and the second wavelength shift amount $\Delta\lambda 2$ in the second wavelength converter are set to satisfy $\Delta\lambda 1 \times \Delta\lambda 2 < 0$ and $|\Delta\lambda 1| < |\Delta\lambda 2|$.

By this setting, the second fiber output light beam may obtain a waveform with excellent flatness in a wavelength region opposite to a wavelength shift direction in the first wavelength conversion. Since the second wavelength filter transmits the region having excellent flatness of the second fiber output light beam, a wavelength converted light beam with an improved quality can be obtained.

Further, since the waveform has an excellent flatness in the wavelength region opposite to the wavelength shift direction in the first wavelength conversion, the second wavelength shift amount $\Delta\lambda 2$ can be increased. As a consequence, for example, 10 nm of wavelength shifting can be performed by the two-stage wavelength conversion, while the wavelength shifting is performed by the wavelength conversion in five stages in the conventional art, whereby the device size can be miniaturized and power consumption can be saved.

Moreover, an optical amplifier is excluded from the second wavelength converter, and the single optical amplifier is used in the two-stage wavelength conversion. Here, a general erbium-doped optical fiber amplifier (EDFA) includes one or more excitation light sources and their drive circuits, one or more isolators, and an erbium-doped optical fiber having a length of several tens m which serves as a gain medium. As a result, there is a limitation in miniaturization of an optical amplifier. Therefore, by excluding an optical amplifier from the second wavelength converter, the wavelength conversion device may be further miniaturized and/or the power consumption may be further saved.

Further, the second wavelength converter may include a variable optical attenuator, so that the second dispersion flat fiber may spread the wavelength spectrum width of the first wavelength converted light beam, which has been attenuated in the variable optical attenuator in order to generate a second fiber output light beam. In this case, even if the second dispersion flat fiber does not have an optimum non-linear constant with respect to the light intensity of the first wavelength converted light beam, the light intensity of the light beam which is input into the second dispersion flat fiber can be adjusted to an optimum value.

What is claimed is:

1. A wavelength conversion device that performs a wavelength shift amount $\Delta\lambda$ of wavelength shifting with respect to an incident light beam, the device comprising:
    a first wavelength converter that comprises: an optical amplifier that amplifies the incident light beam and generates an amplified light beam; a first dispersion flat fiber that spreads the wavelength spectrum width of the amplified light beam and generates a first fiber output light beam; and a first wavelength filter that transmits a predetermined wavelength bandwidth of the first fiber output light beam and generates a first wavelength converted light beam, a center wavelength of the first wavelength converted light beam being shifted by a first wavelength shift amount $\Delta\lambda 1$ from a center wavelength of the incident light beam; and
    a second wavelength converter that does not include an optical amplifier and comprises: a second dispersion flat fiber that spreads the wavelength spectrum width of the first wavelength converted light beam and generates a second fiber output light beam; and a second wavelength filter that transmits a predetermined wavelength bandwidth of the second fiber output light beam and generates a second wavelength converted light beam, a center wavelength of the second wavelength converted light beam being shifted by a second wavelength shift amount $\Delta\lambda 2$ from the center wavelength of the first wavelength converted light beam;
    wherein the first wavelength shift amount $\Delta\lambda 1$ and the second wavelength shift amount $\Delta\lambda 2$ satisfy the conditions $\Delta\lambda 1+\Delta\lambda 2=\Delta\lambda$, $\Delta\lambda 1\times\Delta\lambda 2<0$, and $|\Delta\lambda 1|<|\Delta\lambda 2|$.

2. The wavelength conversion device of claim 1, wherein the second wavelength converter further comprises a variable optical attenuator that attenuates the light intensity of the first wavelength converted light beam, and transmits the attenuated first wavelength converted light beam to the second dispersion flat fiber.

3. The wavelength conversion device of claim 1, further comprising wavelength filters respectively provided at input and output sides of the optical amplifier.

4. A wavelength conversion method that performs a wavelength shift amount $\Delta\lambda$ of wavelength shifting with respect to an incident light beam in a wavelength conversion device, the method comprising:
    amplifying the incident light beam in an optical amplifier and generating an amplified light beam;
    spreading the wavelength spectrum width of the amplified light beam in a first dispersion flat fiber and generating a first fiber output light beam;
    transmitting a predetermined wavelength bandwidth of the first fiber output through a first wavelength filter and generating a first wavelength converted light beam having a center wavelength shifted by a first wavelength shift amount $\Delta\lambda 1$ from a center wavelength of the incident light beam;
    spreading the wavelength spectrum width of the first wavelength converted light beam in a second dispersion flat fiber and generating a second fiber output light beam; and
    transmitting a predetermined wavelength bandwidth of the second fiber output light beam through a second wavelength filter and generating a second wavelength converted light beam having a center wavelength shifted by a second wavelength shift amount $\Delta\lambda 2$ from the center wavelength of the first wavelength converted light beam;
    wherein the first wavelength shift amount $\Delta\lambda 1$ and the second wavelength shift amount $\Delta\lambda 2$ satisfy the conditions $\Delta\lambda 1+\Delta\lambda 2=\Delta\lambda$, $\Delta\lambda 1\times\Delta\lambda 2<0$, and $|\Delta\lambda 1|<|\Delta\lambda 2|$.

5. The wavelength conversion method of claim 4, further comprising spreading, in the second dispersion flat fiber, the wavelength spectrum width of the first wavelength converted light beam that has been attenuated in a variable optical attenuator and generating the second fiber output light beam.

* * * * *